US006925186B2

(12) United States Patent
Bacon

(10) Patent No.: US 6,925,186 B2
(45) Date of Patent: Aug. 2, 2005

(54) AMBIENT SOUND AUDIO SYSTEM

(76) Inventor: Todd Hamilton Bacon, 10410 N. 46th Dr., Glendale, CA (US) 85302

(*) Notice: Subject to any disclaimer, the term of this patent is extended or adjusted under 35 U.S.C. 154(b) by 123 days.

(21) Appl. No.: 10/396,640

(22) Filed: Mar. 24, 2003

(65) Prior Publication Data

US 2004/0190727 A1 Sep. 30, 2004

(51) Int. Cl.[7] ............................ H04B 1/00; H03G 5/00

(52) U.S. Cl. ....................................... 381/119; 381/103

(58) Field of Search ................................ 381/119, 307, 381/61, 63, 103, 99, 97, 104, 107, 109; 369/4; 333/28 R

(56) References Cited

U.S. PATENT DOCUMENTS

| | | | | |
|---|---|---|---|---|
| 4,204,092 A | | 5/1980 | Bruney | |
| 4,633,501 A | * | 12/1986 | Werrbach | 381/100 |
| 4,769,848 A | * | 9/1988 | Eberbach | 381/97 |
| 4,885,782 A | * | 12/1989 | Eberbach | 381/186 |
| 5,325,435 A | * | 6/1994 | Date et al. | 381/1 |
| 5,774,556 A | | 6/1998 | Lowe | |
| 5,799,094 A | | 8/1998 | Mouri | |
| 5,841,879 A | | 11/1998 | Scofield | |
| 5,912,976 A | | 6/1999 | Klayman | |
| 5,930,733 A | | 7/1999 | Park | |
| 5,974,153 A | | 10/1999 | Cashion | |
| 6,009,179 A | | 12/1999 | Wood | |
| 6,072,879 A | * | 6/2000 | Ouchi et al. | 381/61 |
| 6,125,115 A | | 9/2000 | Smits | |
| 6,144,747 A | | 11/2000 | Scofield | |
| 6,175,631 B1 | | 1/2001 | Davis | |
| 6,188,769 B1 | * | 2/2001 | Jot et al. | 381/63 |
| 6,236,730 B1 | | 5/2001 | Cowieson | |
| 6,704,421 B1 | * | 3/2004 | Kitamura | 381/103 |
| 2002/0034307 A1 | | 3/2002 | Kubota | |

FOREIGN PATENT DOCUMENTS

| | | | |
|---|---|---|---|
| JP | 63-292800 | * 11/1988 | 381/119 |

* cited by examiner

*Primary Examiner*—Xu Mei
(74) *Attorney, Agent, or Firm*—Dennis W. Beech

(57) ABSTRACT

The three dimensional audio system may have an audio terminal and a computer input terminal in communication with multiple routing relays. The routing relays may be in communication with a volume calibration control that may be in communication with a volume control and a mute switch. The output of the volume control and the mute switch may be communicated to a variable compressor. The variable compressor may be in serial communication with a digital delay element, a first equalizer and a first variable crossover. The variable crossover may be in serial communication with a second delay element and a second equalizer and in communication with a frequency balance and mix element. The second equalizer may be in serial communication with a frequency balance and mix element that is in serial communication with a phase adjustment element and an output terminal. There may be front and rear elevated speakers.

11 Claims, 6 Drawing Sheets

AMBIENT SOUND AUDIO SYSTEM

BACKGROUND OF THE INVENTION

This invention relates to systems used to reproduce audio sounds. The new system allows reproduction of sound in both azimuth and elevation using two speakers to augment existing sound reproduction systems.

Sound reproduction systems presently exist that provide a listener with a sense of a multi-dimensional sound experience. Such systems may attempt to reproduce the sound that may be a recorded program or a live remotely transmitted grogram. A great deal of work has been undertaken to produce multi-dimensional sound effects through earphones or headsets used by a listener. Also more commonly known sound reproduction, such as, the DOLBY system, are known for use with non-headset systems. The separate speaker oriented systems may be used with two speakers; however, for reasonable surround sound effects three or more speaker systems should be used. The known primary surround sound systems may reproduce sound in a horizontal plane, but may not adequately reproduce sound effects in elevation to recreate overhead or low elevation sound reproduction.

For the controlled earphone or headset user, a binaural mixing console that is manufactured by Head Acoustics GmbD may control each audio input and allow an input sound source to be positioned anywhere relative to the listener on the same plane as the listener as well as above or below. The console is dependent on the use of a special microphone to produce proper sound reproduction. The device may only work effectively with headphones or in small listening environments with one listener and speakers arranged in a unique position relative to the listener. The device may not be compatible with use of more than two speakers.

SUMMARY OF THE INVENTION

The present invention is directed to systems that may produce ambient sound or surround sound using two speakers to augment existing sound systems that simulate both azimuth and elevation audio output. The system may have an audio terminal and a computer input terminal in communication with multiple routing relays. The routing relays may be in communication with a volume calibration control that may be in communication with a volume control and a mute switch. The output of the volume control and the mute switch may be communicated to a variable compressor. The variable compressor may be in serial communication with a digital delay element, a first equalizer and a first variable crossover. The variable crossover may be in serial communication with a second delay element and a second equalizer and in communication with a frequency balance and mix element. The second equalizer may be in serial communication the frequency balance and mix element, a phase adjustment element and an output terminal. There may be a front elevation speaker and a rear elevation speaker.

These and other features, aspects and advantages of the present invention will become better understood with reference to the following drawings, description and claims.

DETAILED DESCRIPTION

The following detailed description represents the best currently contemplated modes for carrying out the invention. The description is not to be taken in a limiting sense, but is made merely for the purpose of illustrating the general principles of the invention.

Figure 1:
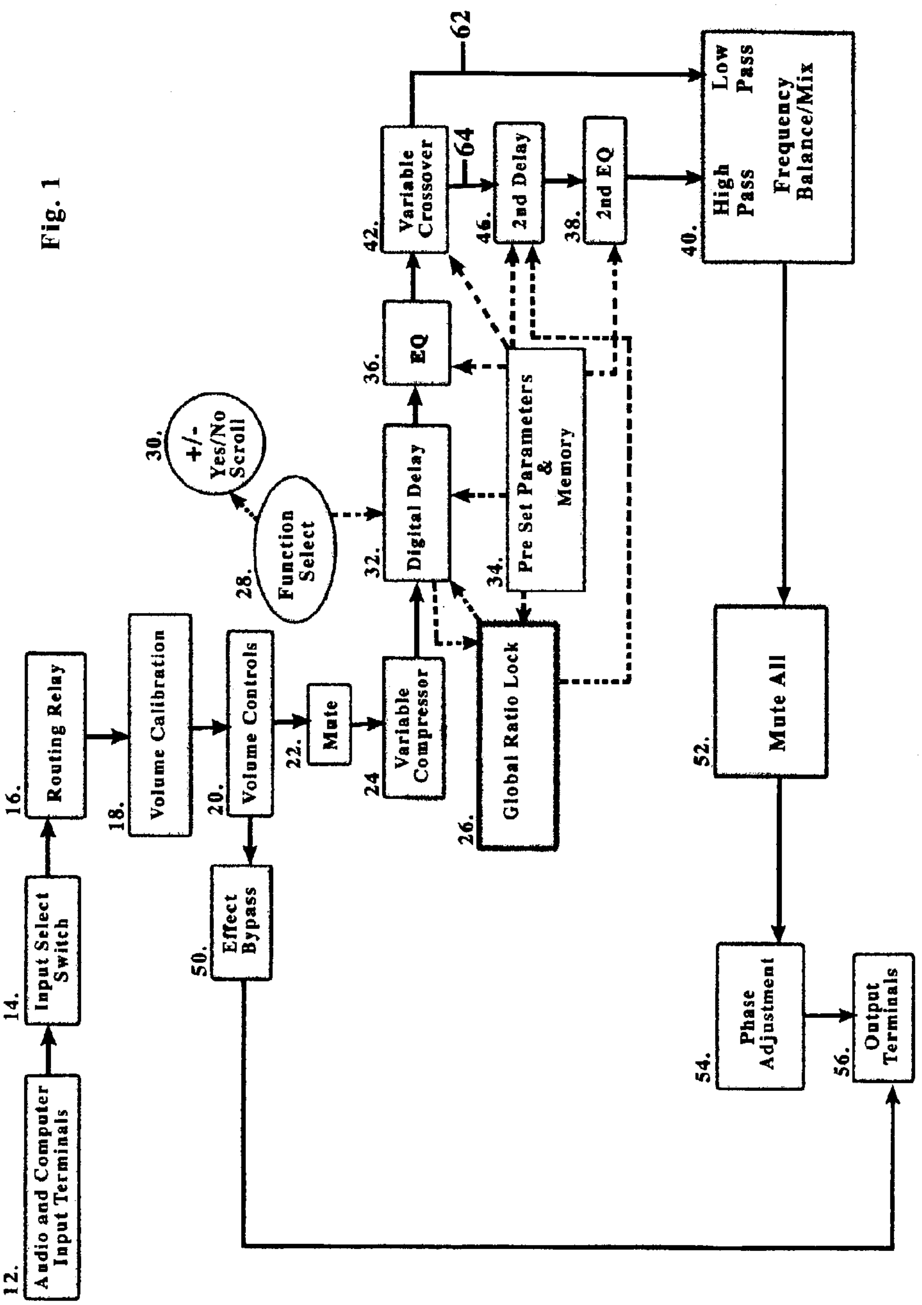
FIG. 1 illustrates a block diagram of the system according to an embodiment of the invention.
Figure 2:
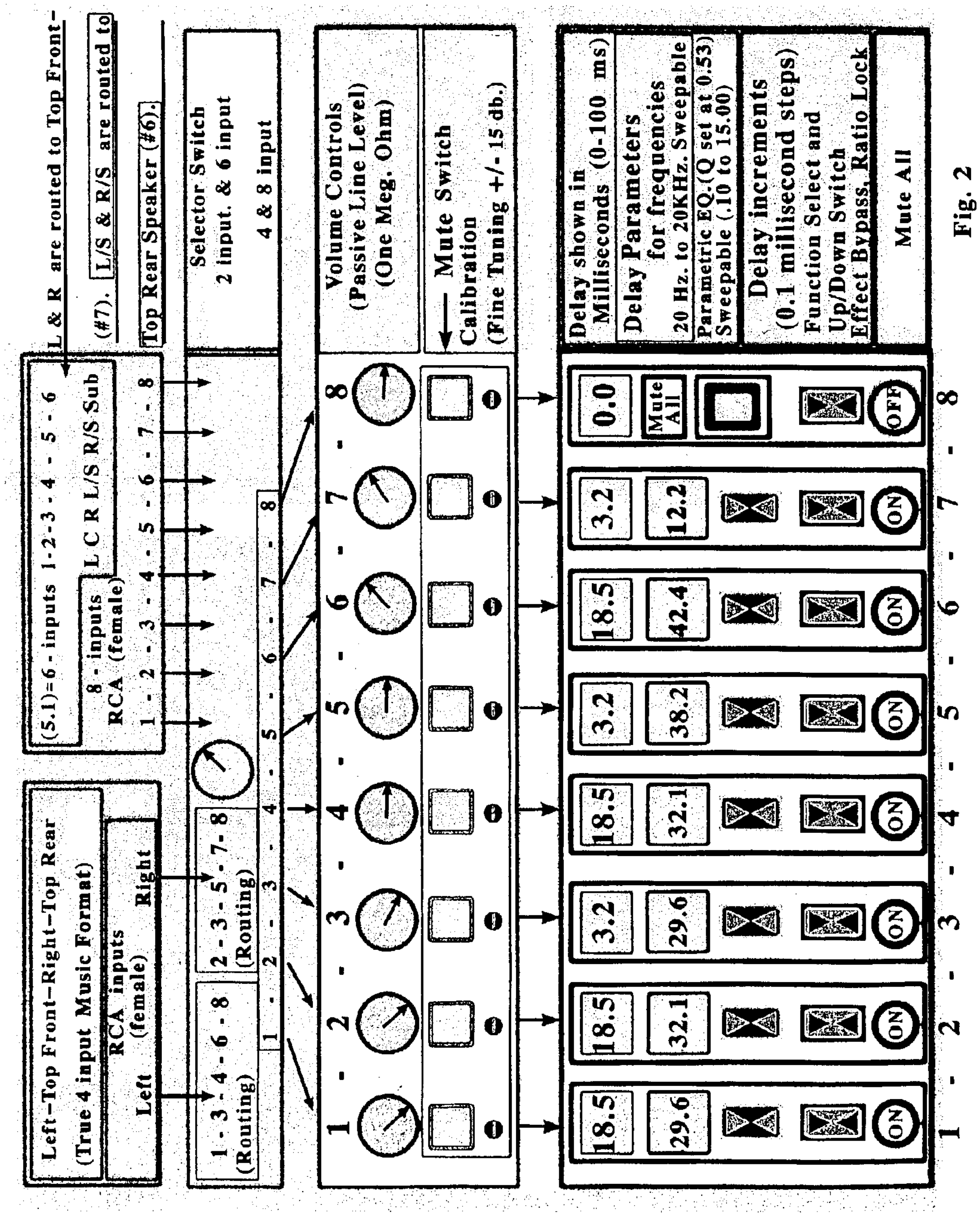
FIG. 2 illustrates a partial control panel with function notations according to an embodiment of the invention.

Referring to FIGS. 1 and 2, there are illustrated a block diagram and partial front panel of the system 10. Audio and computer input terminals 12 may be provided for receipt of audio signals and computer generated commands as well as preset parameter audio representations. An input select switch 14 may be controlled to select routing relays 16 for routing audio signals to various tracks or channels for processing. Examples of such routing may include routing of a two input stereo signal with the left input signal routed to channels 1, 3, 4, 6, 8 and the right input signal routed to channels 2, 3, 5, 7, 8 wherein an 8 track channel system is used to modify signals to create an ambient sound effect for a listener. The term ambient sound may be defined as the encompassing environment of sound to simulate the normal sound environment experienced in a room, hall, etc. when a person is listening to a sound or music presentation. The sound may appear to the listener to come from many directions and distances due to direct, reflective, refractive and diffusive effects on the sound transmission.

In the instance of a three input audio signal, the left input signal may be routed to channel 1, the right signal input to channel 3 and the third signal input to channel 7. For a four input audio signal, the routing may be the left input to channel 1, the right input to channel 3, the top rear input to channel 6 and the top front input to channel 7. For a six input audio signal, the routing may be the left input to channel 1 and 7, the right input to channel 3 and 7, the center input to channel 2, the left surround input to channel 4 and 6 and the right surround input to channel 5 and 6. In the instance of an eight input audio signal, the routing may be the left input to 1, the center input to 2, the right input to 3, the left surround input to 4, the right surround input to 5, the top rear input to 6, the top front input to 7 and the sub woofer input to 8.

There may be a volume calibration control 18 to tune the input audio signal volume prior to individual volume control of each of the routed signals. The calibration control may be scaled for adjustment in increments of 0.1 db steps and allow a range of plus or minus 15 db. Each signal channel may have a volume control 20 for individual channel adjustment that may be a simple passive one megohm control. There may also be a 40 db mute switch 22 for each channel. A variable compressor 24 that may be a simple soft knee compressor may be used to control audio signal threshold levels, ratio, attack, release, output, noise gate threshold and release time.

There may be a global ratio lock 26 to fix or lock all signals or channels delay parameters relative to each other such that any change in delay settings, as for example, in digital delay element 32 or second delay element 46, in one signal will cause all signals to change proportionally to keep relative delay parameters consistent as well as signal width, length and height. This may allow any signal delay change to cause a global size change and not change the shape of the multiple signal virtual environment. For example, in an environment set to sound like a 15 foot wide, 20 foot long and 10 foot high room, when the delay parameters are changed for some speaker elements, such as, right and left side speakers, the other speakers in the system would also have delay parameters adjusted to keep the room proportions relatively comparable, i.e., a 30 foot by 40 foot by 20 foot room.

A function select 28 and scroll feature 30 may be used to scroll through system functions such as digital delay, equalization (EQ), variable crossover settings, saving settings and other functions. The function select 28 may be an up/down switch and the scroll feature 30 may be a +/− or yes/no switch that allows response to questions from the system, such as Save File.

The signals may then be processed by a digital delay element 32. The delay function may have delay increments in 0.1 millisecond steps with a maximum delay of 10.0 seconds and with a feedback feature in 0.5 percent steps ranging from 0 percent to 100 percent. Alternatively, there may be a stored set of preset or predetermined parameters, such as, delay, that may be applied to the signals. The predetermined parameters element 34 may be a portion of a memory device, such as a RAM and/or ROM memory, in the system 10. If a predetermined set of parameters is selected for use in processing the signal, the following elements would also be used to apply those parameters. The predetermined parameter element 34 may apply parameters to the global ratio lock 26, digital delay element 32, first equalizer 36, second equalizer 38, variable crossover 42, and second delay element 46.

The signals may next be processed by a first equalizer 36 that may be a five band parameter equalizer that may control frequency, gain and reduction, and Q. The parameters may have a frequency range of 8 Hz to 32 KHz in 0.1 Hz increments, for example, ten steps from 1 kHz to 2 kHz; gain increments in 0.5 db steps either plus or minus with a maximum gain or reduction of 15 db; and Q settings variable in 0.01 increments from 0.10 to 15.00 plus or minus. There may be a second equalizer 38, following a first variable crossover 42 and a second delay element 46 that may only control altering of three signal bands or frequencies simultaneously.

Following the first equalizer 36 there may be a variable crossover 42 and a second delay element 46. The variable crossover 42 may route a high pass output signal 64 of the chosen frequency and all higher frequencies to the second delay element 46. The frequency adjustments may be 20 Hz to 27 kHz with a slope of 6 db per octave. There may be $2^{nd}$, $3^{rd}$ and $4^{th}$ order slope of 12 db, 18 db and 24 db per octave respectively. The second delay element 46 may be used to control the frequencies above or high pass the chosen crossover frequency point of variable crossover 42, of the chosen frequencies.

The variable crossover 42 may also route a low pass output signal 62 of the chosen frequency and all higher frequencies to a frequency balance and mix element 40. The signal output of the second equalizer 38 that may be the processed high pass output signal 64 may be routed to the frequency balance and mix element 40. The normal setting for the mixing of the received signals in the frequency balance and mix element 40 may be an equal or 50/50 mix of signals.

There may be an effect bypass switch 50 in communication with the volume control 20 that may allow the signals or channels to be routed directly from the volume control 20 to the output terminals 56. This may provide an unprocessed signal directly from the volume control 20 for a better quality sound reproduction.

There may be a mute all switch 52 following the frequency balance and mix element 40 that may mute all signals with a 20 db attenuation. The phase adjustment element 54 may allow phase alignment of any channel in increments of 45 degree steps. The signals may be output to a user interface at output terminals 56.

Figure 3:
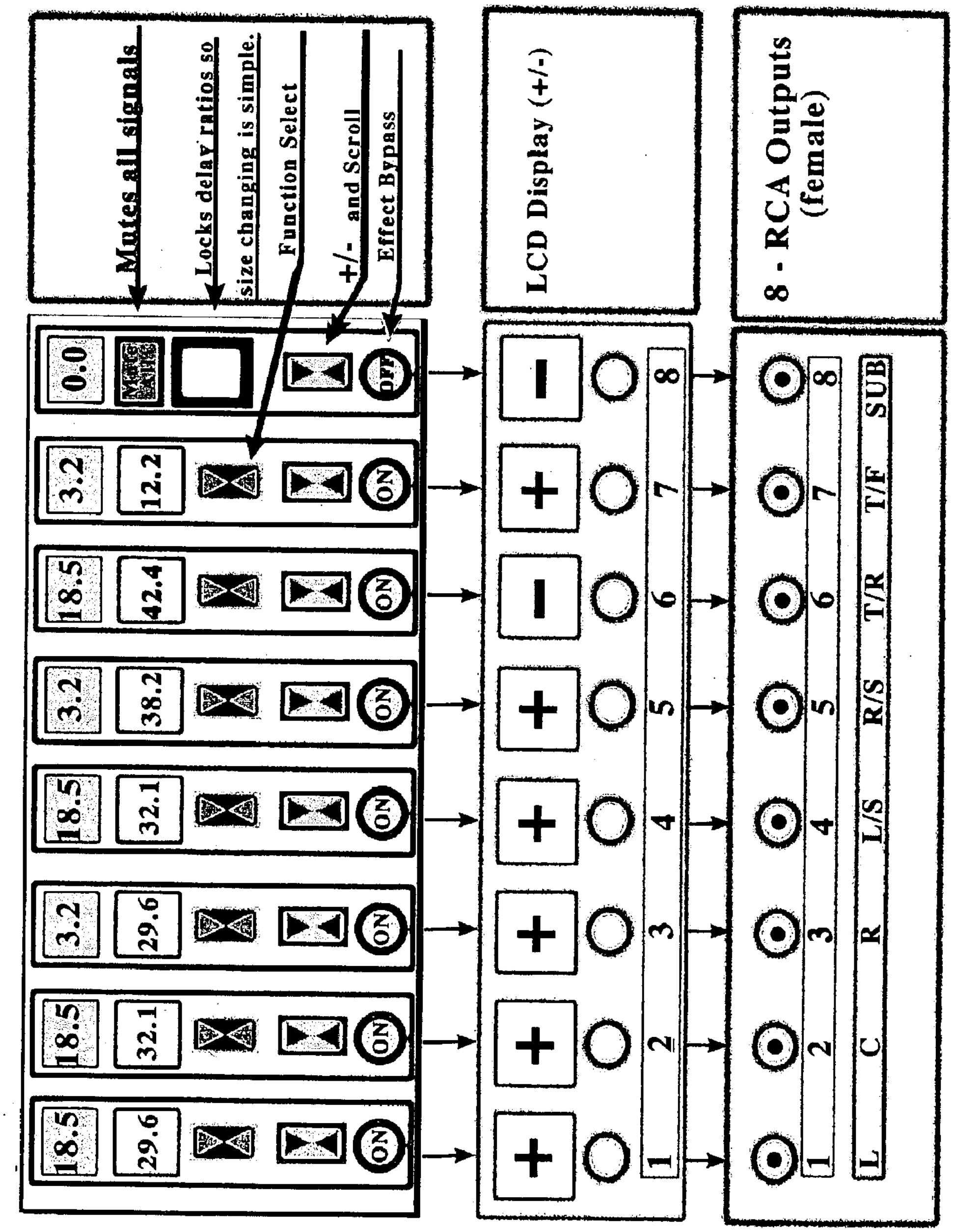
FIG. 3 illustrates a partial control panel with function notations according to an embodiment of the invention.

Referring to FIGS. 2 and 3, an example control panel with notations concerning functions is illustrated.

The system 10 may be used to simulate sound above or below a user by the steps of using at least two signals or tracks and processing using at least one delay element. A first signal may then be equalized for sweetening and then a variable crossover used as a low pass filter with the resulting signal processed by the delay element. A second signal or track with the same input parameters may then be processed by a variable crossover used as a high pass filter, omitting or attenuating the frequencies of the first signal. The second signal may then be processed by the delay element. Use of additional equalizers, etc. may be optional. The parameter settings element may be chosen to create the desired effect in height, sound quality, etc.

Figure 4:
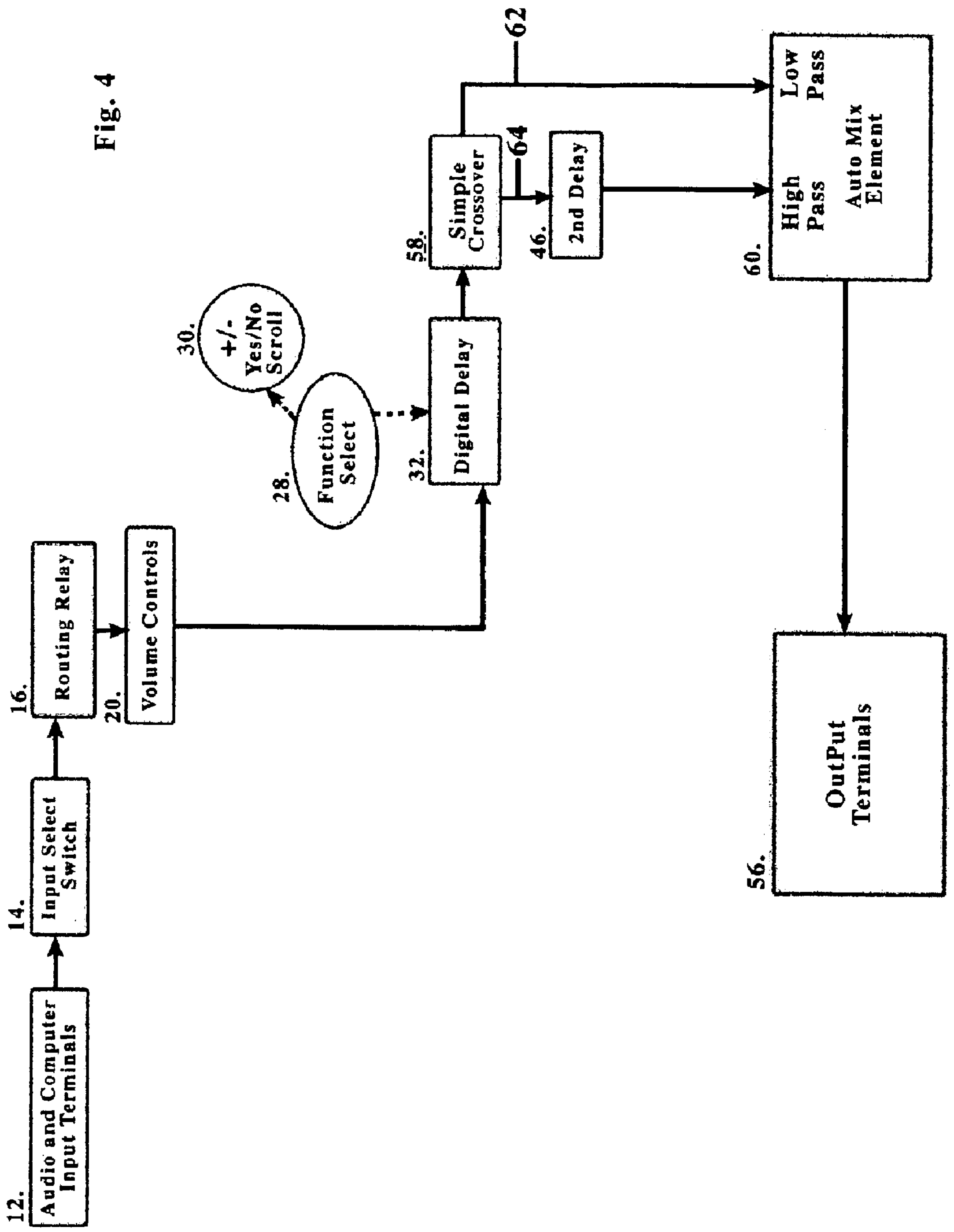
FIG. 4 illustrates a block diagram of the system according to an embodiment of the invention.

Referring to FIG. 4, a simplified version of the system 10 may be used to simulate sound above and below a user. The reduced system 10 may include elements 12, 14, 16, 20, 28, 30, 32, 46 and 56 as well as a simple crossover 58 and an automatic mix element 60. The operation of the audio and computer input terminals 12, input select switch 14, routing relay 16, volume control 20, function select 28, scroll feature 30, digital delay 32, second delay element 46 and output terminals 56 function as described previously.

The simple crossover 58 may operate on a single signal from the digital delay element 32 for each channel to split the signal using a crossover point set at approximately 11 KHz with a first order slope of plus or minus 6 db per octave. The crossover point setting may yield a high pass output signal and a low pass output signal. The low pass output signal may be communicated to the automatic mix element 60. The high pass output signal may be processed by the second delay element 46 and then communicated to the automatic mix element 60.

The automatic mix element 60 may process the low pass output signal 62 and the high pass output signal 64 after processing by the second delay element 46 to perform the automatic mixing function.

Figure 5:
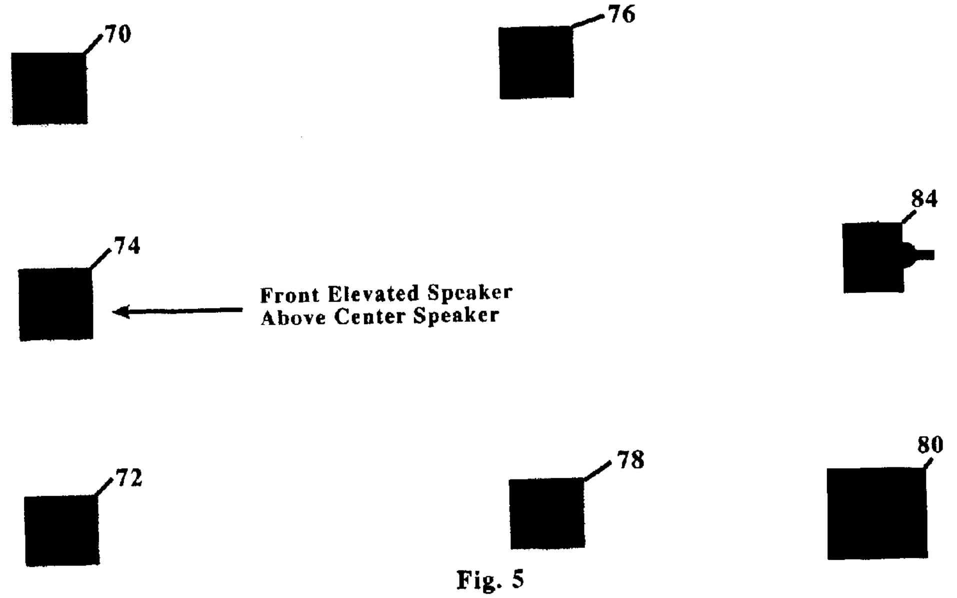
FIG. 5 illustrates a top plan view of a speaker location configuration according to an embodiment of the invention.
Figure 6:
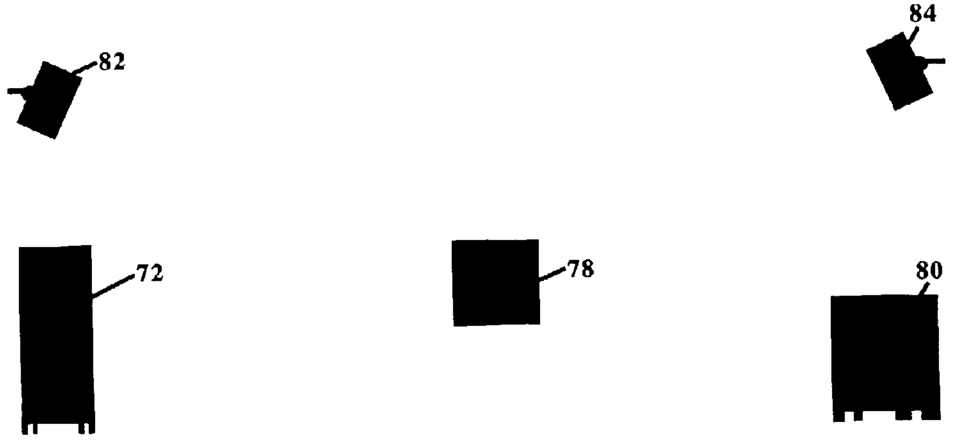
FIG. 6 illustrates a side elevation view of a speaker location configuration according to an embodiment of the invention.

Referring to FIGS. 5 and 6, a representative speaker location configuration using the two elevated sound enhancement channels may be as illustrated. The horizontal plane speakers, right front speaker 70, left front speaker 72, center speaker 74, right side speaker 76, left side speaker 78 and bass speaker 80, may be of a known conventional sound reproduction system. The front elevated speaker 82 and rear elevated speaker 84 may be positioned approximately one foot above the height of a users head, or higher, and oriented to direct sound toward the center of the room. The front elevated speaker 82 may be placed approximately above the center speaker 74. While use of eight speakers has been illustrated, other configurations such as a right front speaker 70, left front speaker 72, front elevated speaker 82 and rear elevated speaker 84 may be used. The system 10 may be used to control the elevated speakers 82, 84 in cooperation with a conventional sound system for control of the other speakers.

Figure 7:
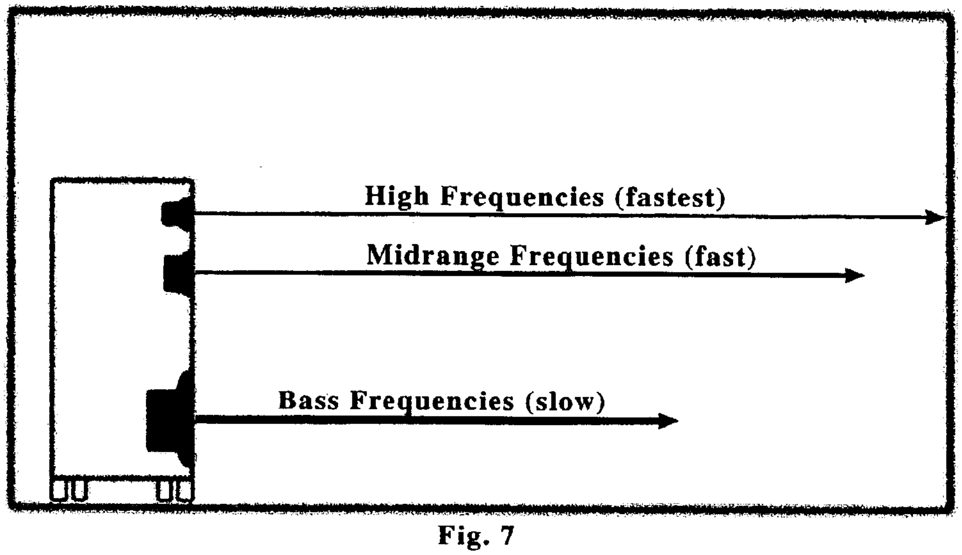
FIG. 7 illustrates a graphic elevation view of direct path transmission of audio frequency.
Figure 8:
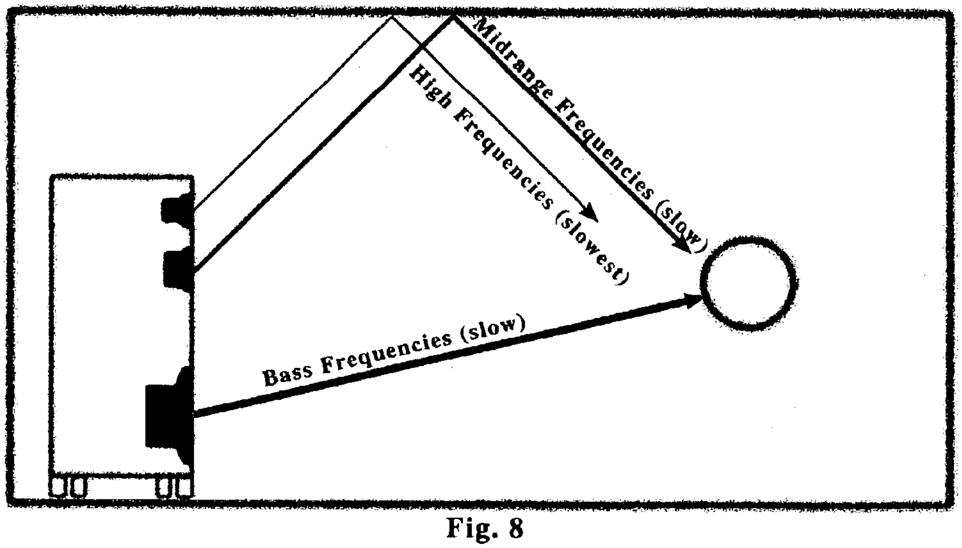
FIG. 8 illustrates a graphic elevation view of direct and reflected path transmission of audio frequency.

Referring to FIGS. 1, 7 and 8, the system 10 with digital delay elements as well as other signal processing elements may be used to simulate azimuth and elevation sound reproduction. As an example, a sense of height from a sound source may be created by delay of the high frequency elements of a sound source similar to the effect a listener may experience from reflection of high frequency sound off the ceiling of a room.

FIG. 7 illustrates a typical arrival pattern for direct sound frequency to a listener wherein the sound bands travel at different speeds in the environment. FIG. 8 illustrates an arrival pattern for bass, mid range and high frequencies wherein the frequencies may be reflected from the ceiling of a room. The bass and mid range frequency bands may arrive at approximately the same time to the listener that may cause sound dialogue and vocal content to appear distinct and the bass sound band appear to have increased sound pressure or sound impact without any adjustment of the volume of the output. Since the high frequencies may arrive at the listener last from ceiling reflection, the effect may be simulated by delay of the high frequency band for a direct transmittal to a listener. The amount of delay selected may create the desired height effect for a sound environment.

The bass band frequencies may not be reflected off a room ceiling as the sound waves may be too large and may appear to emanate from all directions. To simulate height or elevation the mid range frequency and high frequency bands may be processed to simulate elevated sound signals. The bass band, below 250 Hz may not be delayed, the mid range band, between 300 Hz to 3,000 Hz, may be delayed approximately one half the rate of the delay of a high range band, between 4,000 Hz to 32,000 Hz, or stated differently, the time delay of the high range band may be approximately twice the time delay of the mid range band.

The sense of sound elevation to the listener may be created when the mid range and high range frequency bands are delayed. The longer the delay the greater the sense of height. The approximate time to distance relationship may be one millisecond per foot. For example, for a 30 foot high ceiling the delay to simulate the sound travel path with reflection may be approximately 60 milliseconds.

For effectiveness of the height simulation the speakers 82, 84 as viewed in FIG. 6 may be located at least one foot above a listeners ears. This may allow the transmitted sound to be reflected off the lower portion of the cartilage of the outer ear of the listener to impact the ear drum approximately equivalent to elevated sound signal sources in a live sound environment. For example, sounds transmitted in front of a listener may reflect off the rear lower portion of the ear.

To simulate open air overhead sound sources, such as an aircraft, the mid range and high range frequency bands may be reduced in sound volume to simulate a high sound source. The bass frequency band travels further in air and may tend to dominate the received sound the further the sound source may be from the listener.

While the invention has been particularly shown and described with respect to the illustrated embodiments thereof, it will be understood by those skilled in the art that the foregoing and other changes in form and details may be made therein without departing from the spirit and scope of the invention.

I claim:

1. A system to create the effect of ambient audio sound using two speakers to augment existing sound systems comprising:

an audio terminal and a computer input terminal in communication with a plurality of routing relays;

said plurality of routing relays in communication with a volume calibration control that is in communication with a volume control and a mute switch;

the output of said volume control and said mute switch communicated to a variable compressor;

said variable compressor in serial communication with a digital delay element, a first equalizer and a variable crossover;

said variable crossover in serial communication with a second delay element and a second equalizer and said variable crossover in communication with a frequency balance and mix element;

said second equalizer in communication with said frequency balance and mix element;

said frequency balance and mix element in serial communication with a phase adjustment element and an output terminal; and said output terminal in communication with a front elevated speaker and a rear elevated speaker.

2. The system as in claim 1 wherein said computer input terminal is in communication with an input select switch that controls said plurality of routing relays.

3. The system as in claim 1 wherein there is a global ratio lock element in communication with said digital delay element and said second delay element.

4. The system as in claim 1 wherein there is a function select and a scroll feature in communication with said digital delay element.

5. The system as in claim 1 wherein there is a predetermined parameters element in communication with said variable compressor and said digital delay element.

6. The system as in claim 1 wherein said volume control is in communication with an effect bypass switch that is in communication with said output terminal.

7. The system as in claim 1 wherein there is a mute all switch intermediate said frequency balance and mix element and said phase adjustment element.

8. The system as in claim 1 wherein said front elevated speaker and said rear elevated speaker are positioned approximately, at least one foot above the height of an intended users head.

9. A system to create the effect of ambient audio sound using two speakers to augment existing sound systems comprising:

an audio terminal and a computer input terminal in communication with an input select switch;

a plurality of routing relays controlled by said input select switch;

said plurality of routing relays in communication with a volume control that is in communication with a digital delay element;

a function control and a scroll feature in communication with said digital delay element;

said digital delay element in communication with a simple crossover;

said simple crossover in communication with an automatic mix element and a second delay element;

said second delay element in communication with said automatic mix element; and said automatic mix element in communication with an output terminal that is in communication with a front elevated speaker and a rear elevated speaker.

10. The system as in claim 9 wherein said front elevated speaker and said rear elevated speaker are positioned approximately, at least one foot above the height of an intended users head.

11. A method for simulation of ambient sound to a user of a sound reproduction system having two elevated speakers, comprising the steps of:

receiving a plurality of signals and processing each signal in a digital delay element;

processing a first signal in an equalizer;

processing said first signal in a variable crossover element configured as a high-low pass filter;

processing a first high pass output signal of said first signal in a second delay element and a second equalizer;

processing a first low pass output signal of said first signal and said first high pass output signal in a frequency balance and mix element;

processing a second signal in said equalizer;

processing said second signal in said variable crossover element;

processing a second high pass output signal of said second signal in said second delay element and said second equalizer; and processing a second low pass output signal of said second signal and said second high pass output signal in said frequency balance and mix element.

* * * * *